United States Patent

Freund et al.

[11] Patent Number: 6,036,196
[45] Date of Patent: Mar. 14, 2000

[54] COLLET ARRANGEMENT FOR INTEGRATED CIRCUIT STRUCTURES

[75] Inventors: Joseph Michael Freund, Fogelsville; George John Przybylek, Douglasville; Dennis Mark Romero, Allentown, all of Pa.

[73] Assignee: Lucent Technologies Inc., Murray Hill, N.J.

[21] Appl. No.: 09/178,899

[22] Filed: Oct. 26, 1998

[51] Int. Cl.[7] .................................................. B23B 5/22
[52] U.S. Cl. .............................. 279/3; 269/21; 294/64.1
[58] Field of Search .......................... 279/3; 269/21; 294/64.1

[56] References Cited

U.S. PATENT DOCUMENTS

| | | | |
|---|---|---|---|
| 4,603,867 | 8/1986 | Babb et al. | 279/3 |
| 4,659,094 | 4/1987 | Leonov | 279/3 |
| 4,906,011 | 3/1990 | Hiyamizu et al. | 279/3 |
| 5,374,829 | 12/1994 | Sakamoto et al. | 279/3 |
| 5,375,895 | 12/1994 | Volkert | 294/64.1 |
| 5,452,905 | 9/1995 | Bohmer et al. | 279/3 |
| 5,516,125 | 5/1996 | McKenna | 279/3 |
| 5,660,380 | 8/1997 | Reis et al. | 269/21 |
| 5,749,999 | 5/1998 | Dandia | 269/21 |
| 5,753,070 | 5/1998 | Dandia | 269/21 |
| 5,857,667 | 1/1999 | Lee | 269/21 |

*Primary Examiner*—Andrea L. Pitts
*Assistant Examiner*—Monica Smith
*Attorney, Agent, or Firm*—Darby & Darby

[57] ABSTRACT

The conforming, tungsten carbide collet utilized for odd shaped integrated circuit structures is replaced by a plurality of individual collects of the type utilized for integrated circuits. These are typically made of polymide, which is substantially softer than tungsten carbide. In a preferred embodiment, the elongated collect usually used with respect to laser bars is replaced by two individual collects of the type described, which contact the laser bars only near their ends.

10 Claims, 2 Drawing Sheets

COLLET ARRANGEMENT FOR INTEGRATED CIRCUIT STRUCTURES

FIELD OF THE INVENTION

The present invention relates generally to integrated circuit manufacture and, more particularly, concerns a collet arrangement useful for handling and moving integrated circuit structures during manufacture.

BACKGROUND OF THE INVENTION

Integrated circuit laser devices are manufactured on wafers which are two inches in diameter and about 12–20 mils thick. After initial manufacture, the wafers are thinned to about 3.5–4.5 mils and separated into smaller units, called sections, with four sections being derived from a single wafer. The sections are trimmed in one dimension, which we will call length, to be about 0.4 inches long. They are also scored across their widths to define 20–30 subdivisions, called bars, which are about 12 mils wide and about 0.4 inches long.

During subsequent processing, the sections are divided into bars by breaking or cleaving them along the scribed lines, to form facets along their elongated sides. After the cleaving process, the cleaved laser bars are transported side-by-side on a plastic film sheet, with their lengths extending laterally of the sheet. Before the bars are cleaved into individual chips, the individual chips on each bar are tested. This requires removal of the bars from the sheet and their placement into a test fixture. After testing and other operations, the bars are replaced on the sheet and subjected to further cleaving in order to separate the individual laser devices.

The laser bars and the individual chips are small, delicate structures, which are not to be handled by hand. Accordingly, a handling probe, called a "collet" has typically been used to handle integrated circuit structures. A collet typically has a handling head which is shaped to conform to the integrated circuit structure and which is connected to a vacuum source, which permits the handling head to retain the structure. For example, collets for laser bars are long and narrow, owing to the shape of the bar. Furthermore, the handling head must be formed with a long narrow slot to accommodate the application of the vacuum to the long, narrow laser bar. Typically, this slot is 12 mils by 320 mils. Such diverse dimensions can be achieved reliably only with electrical discharge machining (EDM) and the use of tungsten carbide as the collet material. However, tungsten carbide is a relatively abrasive material, and it often happens that, in handling the bar, the collet will brush against its surface. This can damage the relatively soft materials on the surface of the chip and, particularly, the gold contacts and conductive portions.

In accordance with the present invention, the conforming collet utilized for integrated circuit structures is replaced by a plurality of individual collets of the type utilized for integrated circuits. These are typically made of polymide, which is substantially softer than tungsten carbide which is used for larger collects of odd shape. In a preferred embodiment, the elongated collet usually used with respect to laser bars is replaced by two individual collects of the type described, which contact the laser bars only near their ends.

BRIEF DESCRIPTION OF THE DRAWINGS

The foregoing brief description, as well as other objects, features and advantages of the present invention will be understood more completely from the following detailed description of a presently preferred, but nonetheless illustrative embodiment in accordance with the present invention, with reference being had to the accompanying drawings, in which.

DETAILED DESCRIPTION OF THE PREFERRED EMBODIMENT

Figure 1:
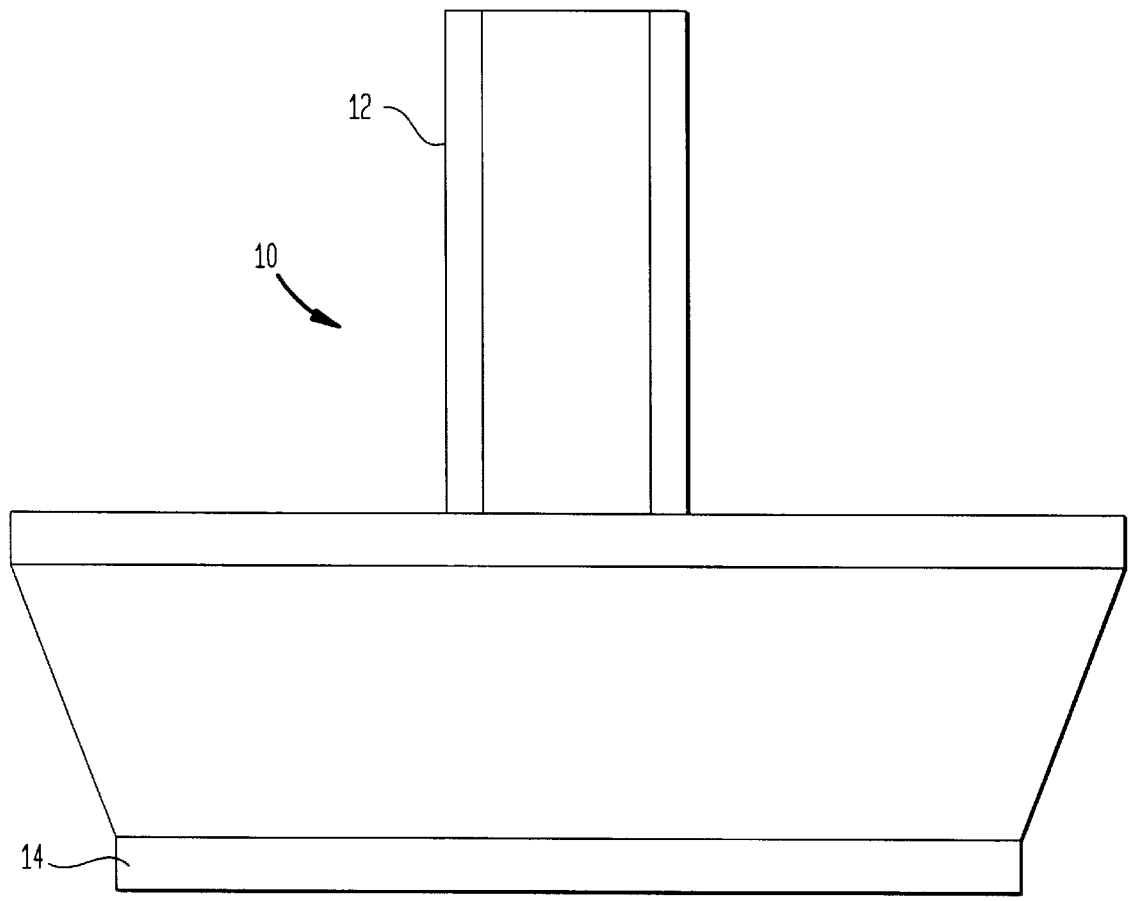
FIG. 1 is a side view illustrating the type of collet currently used with respect to laser bars.
Figure 2:
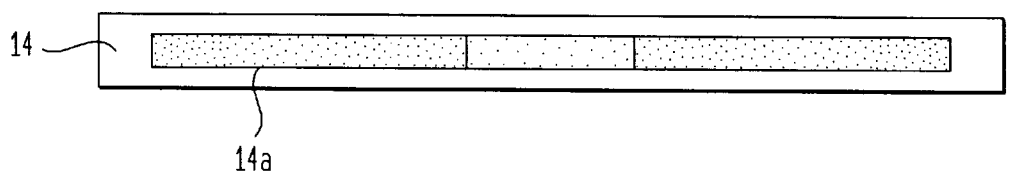
FIG. 2 is a bottom view of the collect of FIG. 1.

Turning now to the drawings, FIGS. 1 and 2 illustrate a collet 10 of the type currently utilized to handle laser bars. The collet has a neck 12 which is adapted to be connected to a source of vacuum (not shown) and a handling head 14. As best seem in FIG. 2, the handling head 14 has an aperture 14a which is typically about 12 mils by 320 mils in size, in order to accommodate a typical laser bar. Owing to the extremely long and narrow shape of the aperture 14a, this aperture can be achieved reliably only with electrical discharge machining and typically requires that at least the handling head 14 be made of tungsten carbide.

In use, the collet would be lowered towards a laser bar to be picked up and the vacuum provided via neck 12 would be effective to draw the laser bar up into contact with the handling head 14, where it would be retained by vacuum until the vacuum is removed. As already explained, in the process of picking up the laser bar it is not uncommon for the handling head 14 to brush against the laser bar, introducing the danger of damage to the laser bar by the relatively abrasive surface of the handling head 14.

Figure 3:
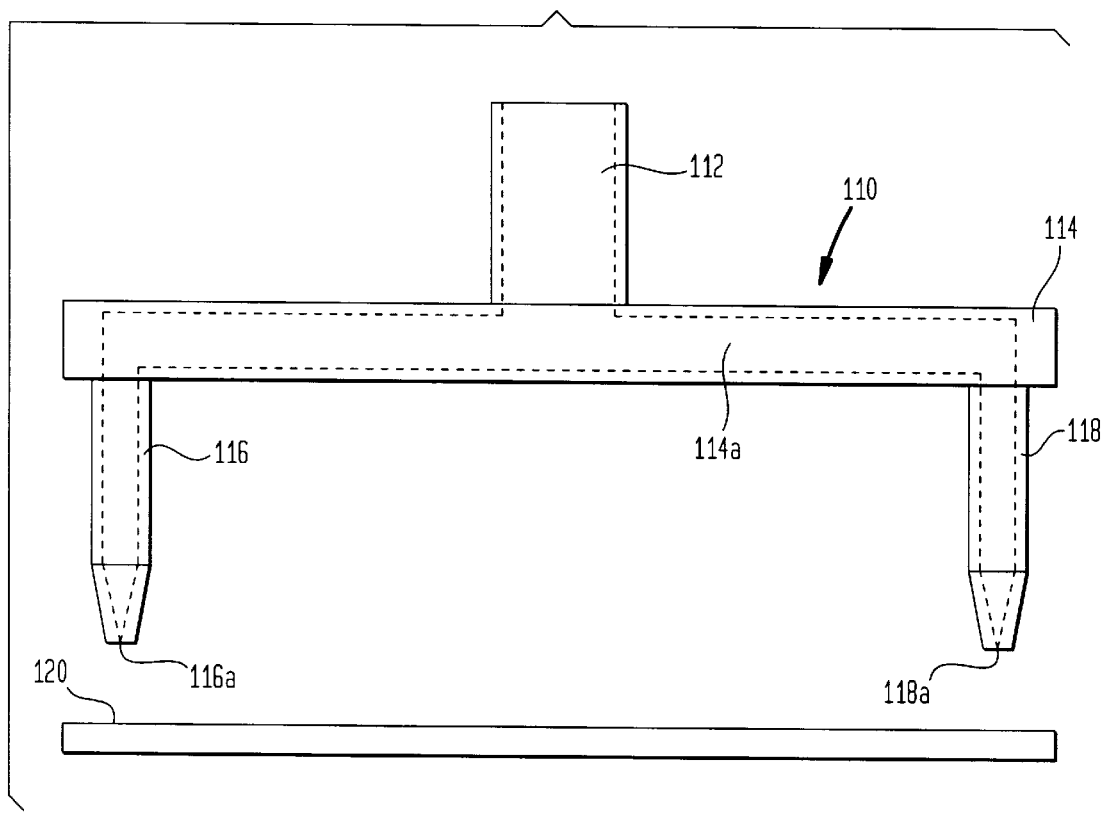
FIG. 3 is a side view of preferred embodiment of a collect arrangement in accordance with the present invention configured to handle laser bars, the collet being shown in position to pick up a laser bar.

FIG. 3 illustrates a preferred embodiment of a collet arrangement in accordance with the present invention, this particular arrangement being made to handle a laser bar 120. The collet arrangement 110 includes a neck 112 which is adapted to be connected to a source of vacuum, as by an appropriate fitting and hose (not shown). The neck 112 is connected to a main body 114, which, in turn, has the collets 116, 118 mounted to it so as to protrude downwardly. Within the main body 114, an in interior chamber or passageway 114a is provided which connects the inside of neck 112 with the interiors of collets 116 and 118. The collets 116, 118 are of a conventional design and are of a type which is commonly used to handle integrated circuit chips. Preferably, they are made of polymide, a material which is substantially softer than tungsten carbide. The collets 116, 118 have hollow interiors and come to a point, providing openings 116a, 118a which is about 8 mils in diameter. Thus, the collet has a contact area in which both dimensions are comparable and smaller than the smallest dimension of the laser bar. This further reduces the likelihood of damaging contact from the collet. In the present instance, the collets are configured to handle a laser bar and, accordingly, are positioned to be about 300–320 mils apart, so as to handle the laser bar near its ends. This minimizes the likelihood of any damage the laser bar resulting from the sliding contact of the collets 116, 118 on the surface of the laser bar 120.

For more positive handling of laser bars, additional collets could be added in spaced relationship to the collets 116, 118. In addition, it is contemplated that integrated circuit structures of various shapes could be handled efficiently by arranging a plurality of spaced collets proximate the periphery of the structure and in an arrangement conforming to the shape of the periphery. It is also contemplated that the collet arrangement of FIG. 3 could be used to handle individual laser chips after they are cleaved from the bar, without any adjustment to the collet arrangement, by simply positioning one of the collets over a chip desired to be handled.

Although preferred embodiments of the invention have been disclosed for illustrative purposes, those skilled in the art will appreciate that many additions, modifications and substitutions are possible without departing from the scope and spirit of the invention as defined by the accompanying claims.

What is claimed:

1. A collet arrangement for handling integrated circuit structures comprising:
    a main body including a portion which is connectable to a source of vacuum and positionable over the integrated circuit structure, said body having an interior chamber in communication with said source of vacuum, when connected;
    a plurality of depending collets in communication with said chamber, each having a lower contact end having a contact area for said structure in which height and width dimensions are comparable and no greater than the smallest distance across the structure in an area to be contacted by the contact area, the collets being positioned in spaced relationship over said structure.

2. The arrangement of claim 1 wherein the collets are made of a material which is softer than tungsten carbide.

3. The arrangement of claim 2 wherein the collets are made of polymide.

4. The arrangement of claim 1 wherein the structure is a laser bar, there being two collets positioned proximate either end of the bar.

5. The arrangement of claim 4 wherein the collets are made of a material which is softer than tungsten carbide.

6. The arrangement of claim 5 wherein the collets are made of polymide.

7. A collet arrangement for handling integrated circuit structures comprising:
    a main body including a portion which is connectable to a source of vacuum and positionable over the integrated circuit structure, said body having an interior chamber in communication with said source of vacuum, when connected:
    a plurality of depending collets in communication with said chamber, each having a lower contact end having a contact area for said structure in which height and width dimensions are comparable and no greater than the smallest distance across the structure in an area to be contacted by the contact area, the collets being positioned in spaced relationship over said structure, the structure being a laser bar having been two collets positioned proximate either end of the bar;
    wherein said collets are made of polymide, are generally conical at their contact ends and have a lower opening of about 8 mils in diameter.

8. The arrangement of claim 1, wherein said structure has a periphery, the collets being disposed in spaced relationship proximate said periphery.

9. The arrangement of claim 8 wherein the collets are made of a material which is softer than tungsten carbide.

10. The arrangement of claim 9 wherein the collets are made of polymide.

* * * * *